US010128397B1

(12) United States Patent
Bai et al.

(10) Patent No.: US 10,128,397 B1
(45) Date of Patent: Nov. 13, 2018

(54) LOW EXCESS NOISE, HIGH GAIN AVALANCHE PHOTODIODES

(75) Inventors: Xiaogang Bai, South Pasadena, CA (US); Ping Yuan, Simi Valley, CA (US); Rengarajan Sudharsanan, Stevenson Ranch, CA (US)

(73) Assignee: THE BOEING COMPANY, Chicago, IL (US)

( * ) Notice: Subject to any disclaimer, the term of this patent is extended or adjusted under 35 U.S.C. 154(b) by 157 days.

(21) Appl. No.: 13/476,437

(22) Filed: May 21, 2012

(51) Int. Cl.
| H01L 29/66 | (2006.01) |
| H01L 31/107 | (2006.01) |
| H01L 31/14 | (2006.01) |
| H01L 31/18 | (2006.01) |
| H01L 31/0352 | (2006.01) |
| H01L 31/0304 | (2006.01) |

(52) U.S. Cl.
CPC .......... *H01L 31/107* (2013.01); *H01L 31/184* (2013.01); *H01L 31/0304* (2013.01); *H01L 31/035236* (2013.01)

(58) Field of Classification Search
CPC ............... H01L 31/107; H01L 31/1075; H01L 31/035236; H01L 31/02027
USPC .................................. 257/21, 186, 199, 438
See application file for complete search history.

(56) References Cited

U.S. PATENT DOCUMENTS

| 5,432,361 | A | * | 7/1995 | Taguchi ........................ 257/186 |
| 5,471,068 | A | * | 11/1995 | Tsuji ....................... B82Y 20/00 257/18 |
| 5,552,629 | A | * | 9/1996 | Watanabe ...................... 257/438 |
| 5,723,877 | A | * | 3/1998 | Sugawa .............. H01L 31/1075 257/186 |
| 7,432,537 | B1 | | 10/2008 | Huntington |
| 2003/0047752 | A1 | * | 3/2003 | Campbell ............. H01L 31/107 257/186 |
| 2009/0242934 | A1 | * | 10/2009 | Hu ....................... H01L 31/1075 257/186 |
| 2009/0272903 | A1 | * | 11/2009 | Kato ...................... B82Y 20/00 250/338.4 |
| 2011/0233708 | A1 | * | 9/2011 | Washino ............... H01L 31/107 257/436 |
| 2011/0284927 | A1 | * | 11/2011 | Achouche ........... H01L 31/1075 257/186 |

OTHER PUBLICATIONS

Sze, S.M., Ng, Kwok K.; "Physics of Semiconductor Devices", Oct. 2006, 3rd Edition, pp. 56-60.*
Y. Kang , P. Mages , A. R. Clawson , P. K. L. Yu , M. Bitter , Z. Pan , A. Pauchard , S. Hummel and Y. H. Lo, "Fused InGaAs-Si avalanche photodiodes with low-noise performances", IEEE Photon. Technol. Lett., vol. 14, p. 1593, 2002.
A. Huntington, M. Compton, S. Coykendall, G. Soli, G.M. Williams, "Linear-mode single-photon-sensitive avalanche photodiodes for GHz-rate near-infrared quantum communications", IEEE Military Communications Conference, 2008, p. 1, Nov. 2008.

\* cited by examiner

*Primary Examiner* — Steven Loke
*Assistant Examiner* — David Spalla

(57) ABSTRACT

A system, method, and apparatus for an avalanche photodiode with an enhanced multiplier layer are disclosed herein. In particular, the present disclosure teaches an avalanche photodiode having a multiplier with alternating layers of one or more quantum wells and one or more spacers. A method of making the avalanche photodiode includes growing the multiplier on a substrate.

26 Claims, 3 Drawing Sheets

LOW EXCESS NOISE, HIGH GAIN AVALANCHE PHOTODIODES

GOVERNMENT LICENSE RIGHTS

This disclosure was made with Government support under contract number NNG09CP07C awarded by NASA. The U.S. Government has certain rights in this invention.

BACKGROUND

The invention is directed to methods and materials used with photodiodes to form high avalanching probability layers in the form of quantum wells to achieve low excess noise and high optical gain.

SUMMARY

The present disclosure relates to a method, system, and apparatus for a photodiode with one or more high avalanching probability layers that contribute to low excess noise and high gain in the photodiode. In one or more embodiments, the present disclosure teaches a method of improving the optical gain and reducing excess noise of a photodiode that includes growing a multiplier to a substrate to form the photodiode. The multiplier has a plurality of alternating high avalanching probability layers and low avalanching probability layers. Each of the high avalanching probability layers substantially comprises a first material, and each of the low avalanching probability layers substantially comprises a second material. In at least one embodiment, the first material comprises Indium Gallium Aluminum Arsenide, and in at least one embodiment, the second material comprises Indium Aluminum Arsenide.

In one or more embodiments, the present disclosure teaches a photodiode that includes a substrate and a multiplier grown on the substrate. The multiplier has a plurality of alternating high avalanching probability layers substantially comprising a first material and low avalanching probability layers substantially comprising a second material. In at least one embodiment, the first material comprises Indium Gallium Aluminum Arsenide, and in at least one embodiment, the second material comprises Indium Aluminum Arsenide.

The features, functions, and advantages can be achieved independently in various embodiments of the present inventions or may be combined in yet other embodiments.

DRAWINGS

These and other features, aspects, and advantages of the present disclosure will become better understood with regard to the following description, appended claims, and accompanying drawings where:

DESCRIPTION

Figure 2:
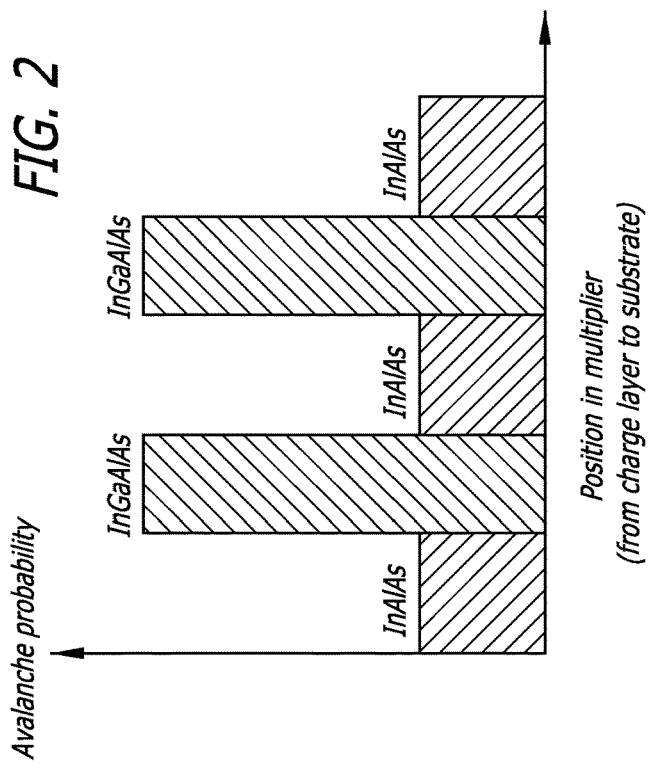
FIG. 2 shows a graphical illustration of avalanche probability relative to position in the avalanche photodiode of FIG. 1.

Avalanche photodiodes ("APDs") are widely used to sense and amplify optical signals into electrical signals based on their high quantum efficiency of photon detection and desirable internal gain. The high internal gain associated with APDs, however, may also lead to increased levels of excess noise, which can negatively impact the signal-to-noise ratio achieved with such APDs. In particular, avalanche multiplication that occurs as electron-hole pairs are created in the active area, or multiplier, of the APD by carriers accelerated by the electric field can result in increased gain compared with other photodiodes. However, this increased gain may in turn lead to increased excess noise. For example, the typical optical gain is limited to less than 50 for typical III-V compound semiconductor APDs due to the high excess noise factor. In most systems, the APDs are operated at a gain of only 10 due to the reliability concerns. Significantly, the noise properties of an APD are affected by the materials forming the APD. The excess noise created by an APD is a critical figure of merit for the APD, as the maximum usable gain of the APD is related to the excess noise generated. As such, a low excess noise and high gain APD is preferred that results in an improved signal-to-noise ratio.

Various attempts to improve upon the signal-to-noise ratio have included, for example, bonding a III-V compound semiconductor to a Silicon (Si) wafer. In this approach, the III-V compound semiconductor absorbs the incident light, and the photo-generated carriers are amplified in the Si multiplier, which has very little excess noise. However, the technical barrier for this approach is the interface between the III-V compound semiconductor and Si wafer. In particular, the defect density of the interface is usually too high to result in an APD with acceptable dark currents. Moreover, Si can present difficulties in forming a lattice match, as many materials will not readily match with Si. Another approach is to build a multi-stage multiplier. Here, the purpose is to amplify the carriers in multiple stages like a photomultiplier tube, wherein every stage consists of a high electric field region and two adjacent doping layers control the electric field. This approach could possibly achieve high gain. However, the growth control for the multiplier structure demands great accuracy in doping at a scale of 10 nm, which may be difficult to achieve. Also, these types of devices suffer from high dark currents at high gain levels, thus preventing their use at high gain.

To improve upon the signal-to-noise ratio, this invention aims to reduce the APD excess noise and increase the usable optical gain to over at least 100. At the same time, the gain bandwidth product is expected to increase, which would be beneficial across many applications.

In the following description, numerous details are set forth in order to provide a more thorough description of the system. It will be apparent, however, to one skilled in the art, that the disclosed system may be practiced without these specific details. In the other instances, well-known features have not been described in detail so as not to unnecessarily obscure the system.

Figure 1:
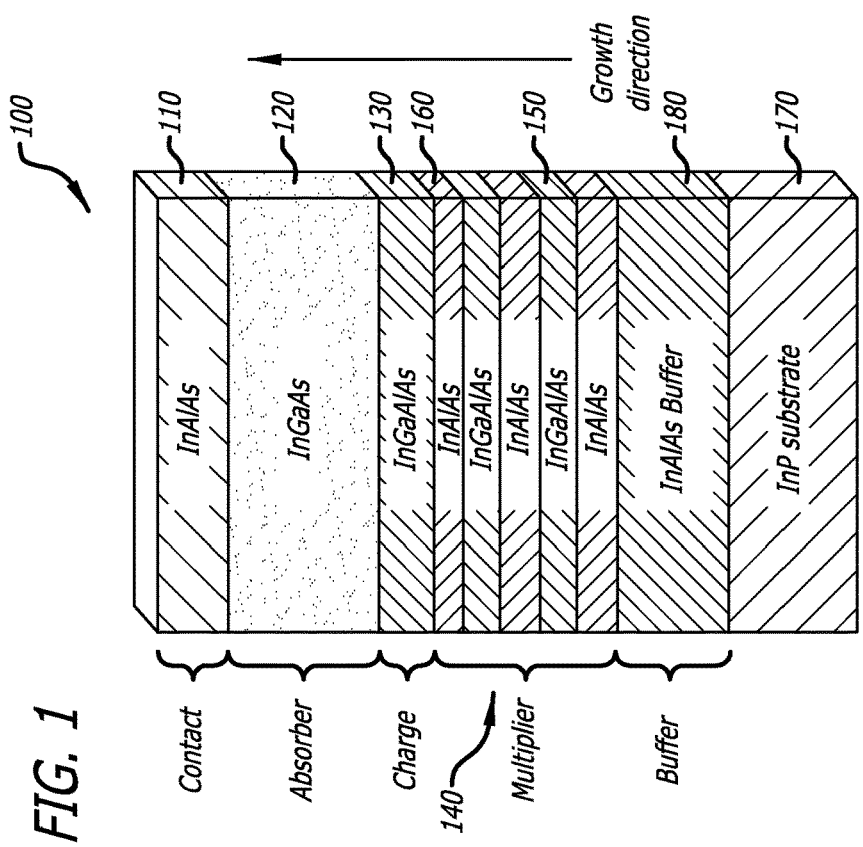
FIG. 1 shows an illustration of an embodiment of an avalanche photodiode.

The methods and apparatus disclosed herein provide a system for creating one or more quantum wells in an APD to improve gain and reduce excess noise. In particular, this invention introduces an enhancement to the multiplier of the APD, namely a thin layer of material, that improves upon optical gain and excess noise reduction of the APD. Referring to FIG. 1, one embodiment of an APD 100 is shown that achieves high gain and low excess noise. In the illustrated embodiment, the APD 100 features a contact layer of Indium Aluminum Arsenide (InAlAs) 110, an absorber layer of Indium Gallium Arsenide (InGaAs) 120, and a charge layer of Indium Gallium Aluminum Arsenide (InGaAlAs) 130.

The APD 100 also includes a multiplier 140 having one or more layers of quantum wells 150 formed substantially of a first material and one or more spacer layers 160 formed substantially of a second material. In the illustrated embodiment, there are two quantum wells formed of InGaAlAs 150 with alternating spacer layers 160 formed of InAlAs that are between the wells 150. Each quantum well 150 has a band gap of about 1.3 electron-volts (eV). In alternative embodiments, the structure may include a different number of quantum wells 150, such as one quantum well or three quantum wells, and a different number of spacer layers 160. Also in alternative embodiments, the quantum wells 150 and/or spacers 160 may be formed of a different material. For example, the spacer 160 may be formed of semiconductor materials other than InAlAs, like InGaAlAs with a bandgap close to InAlAs and higher than the bandgap of the quantum well 150 material InGaAlAs.

In the illustrated embodiment, to further reduce excess noise, the quantum wells are lattice-matched to a substrate 170 for lattice-matched growth of the quantum wells 150 on the substrate 170. In the illustrated embodiment, the substrate 170 is formed of Indium Phosphide (InP). To assist with and help control growth of the quantum wells 150, the APD 100 may also include a buffer layer 180 between the substrate 170 and the multiplier 140. In alternative embodiments, the quantum wells 150 are not lattice-matched and a buffer may not be included.

The quantum wells 150 and the spacer 160 are not intentionally doped. In other words, no dopants are intentionally added to the quantum wells 150 as part of the production process, however, it is possible that there may be incidental occurrences of other materials in the wells 150, such as, for example, Silicon, Oxygen, Carbon, Zinc, and Sulfur. By not intentionally doping the quantum wells 150 and the spacer 160, a constant electrical field strength is maintained across the multiplier during operation of the APD.

Significantly, the respective materials in the quantum wells 150 (InGaAlAs) and the spacers 160 (InAlAs) have different impact ionization threshold energies. When reverse-bias voltage is applied across the APD 100, the carriers in the APD 100 are accelerated by the electric field in the multiplier 140. FIG. 2 illustrates the avalanche probability across positions of the multiplier 140 under typical operating conditions. As FIG. 2 shows, the avalanche probabilities are higher in the quantum wells 150 than in the spacers 160. Moreover, most of the avalanche events in the APD 100 occur inside the quantum wells 150. The localization of the avalanche events in the quantum wells 150 results in low excess noise. When the carriers enter one of the quantum wells 150, they have a high probability to avalanche and provide gain. Thus, with the presence of the multiple quantum wells 150, the overall APD optical gain becomes very high at moderate electric fields.

The low excess noise and high gain for such an APD structure consequently results in a high gain bandwidth product. In view of other APD structures, this APD 100 featuring the quantum wells 150 exhibits small gain dependence on the bias voltage at a given gain.

Another benefit to the illustrated APD structure is that the quantum wells 150 are not intentionally doped with other materials. In APDs that requiring doping the components, particularly the multiplier, with additional materials, the doping must be carefully controlled for a high level of process accuracy in order to achieve favorable gain with the APD structure. This doping process can lead to high production costs and limited efficiency and throughput. Eliminating the doping process thus can lead to increased production and efficiency, as high gain in the structure does not rely on accurate doping.

Figure 3:
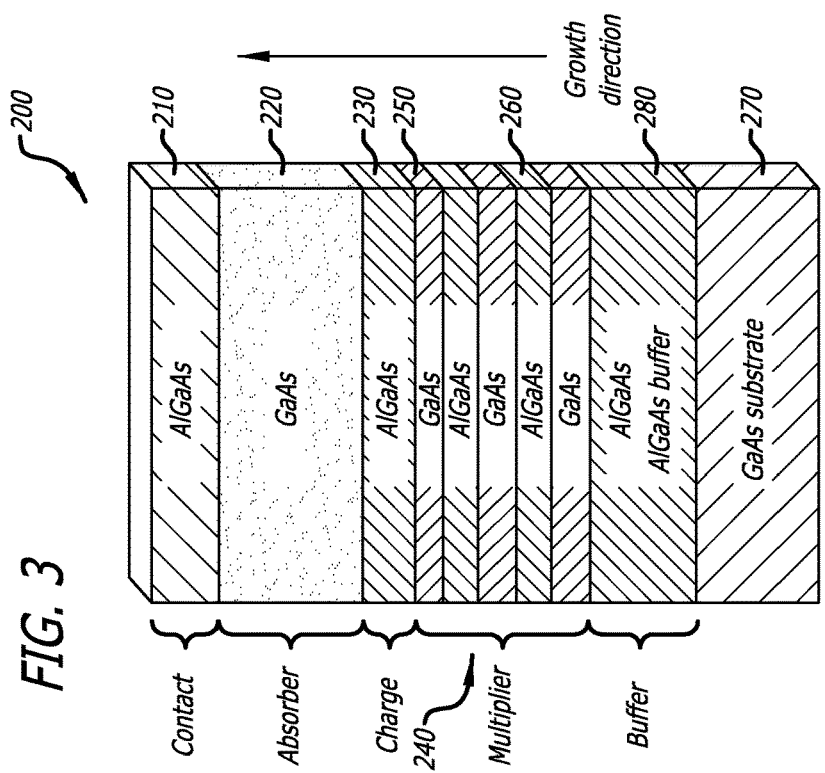
FIG. 3 shows an illustration of an alternative embodiment of the avalanche photodiode in FIG. 1.

As another example of an APD with a structure resulting in high gain and low excess noise, FIG. 3 shows an alternative embodiment of an APD 200. The APD 200 features a contact layer of Aluminum Gallium Arsenide (AlGaAs) 210, an absorber layer of Gallium Arsenide (GaAs) 220, and a charge layer AlGaAs 230. The APD 200 also includes a multiplier 240 having one or more layers of quantum wells 250. In the illustrated embodiment, there are three quantum wells formed of GaAs 250 with alternating spacer layers 260 formed of AlGaAs that are between the wells 250. The quantum wells 250 are lattice-matched to a substrate 270 for lattice-matched growth of the quantum wells 250 on the substrate 270. In the illustrated embodiment, the substrate 270 is formed of GaAs. To assist with and help control growth of the quantum wells 250, the APD 200 includes a buffer layer 280 of AlGaAs between the substrate 270 and the multiplier 240. In this case, the spacer 260 could also be AlGaAs with bandgaps differing from that of the quantum well 250 GaAs. The buffer layer 280 may also be removed in the design.

Figure 4:
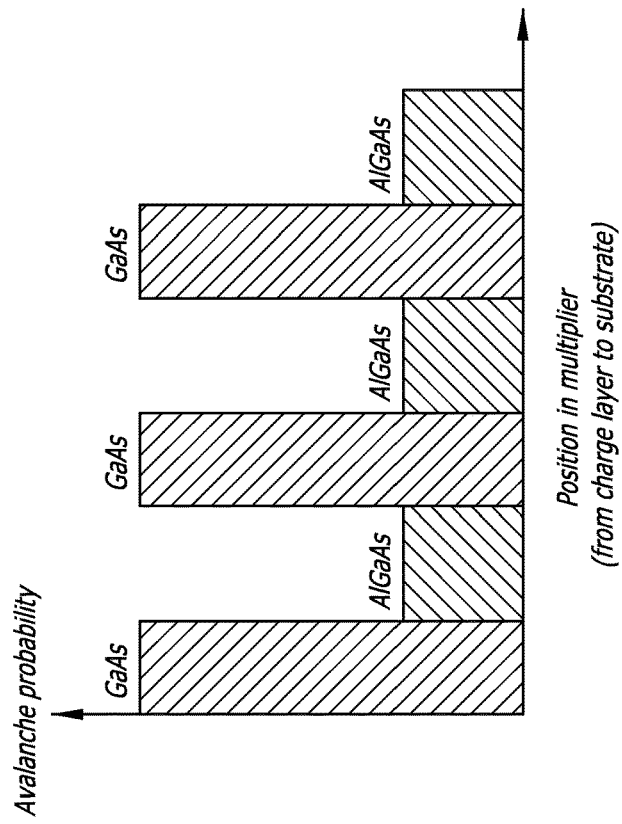
FIG. 4 shows a graphical illustration of avalanche probability relative to position in the avalanche photodiode of FIG. 3.

FIG. 4 illustrates the avalanche probability across positions of the multiplier 240 under typical operating conditions. As FIG. 4 shows, the avalanche probabilities are higher in the quantum wells 250 than in the spacers 260. Moreover, most of the avalanche events in the APD 200 occur inside the quantum wells 250, and the excess noise is low. Notably, as with the embodiment of the APD 100 shown in FIG. 1, the materials in the APD 200 are not intentionally doped, such that doping accuracy is not a factor in achieving high gain. In an alternative embodiment, the GaAs in the quantum well 250 could be replaced with an AlGaAs layer with a different bandgap from that of the spacer 260.

Figure 5:
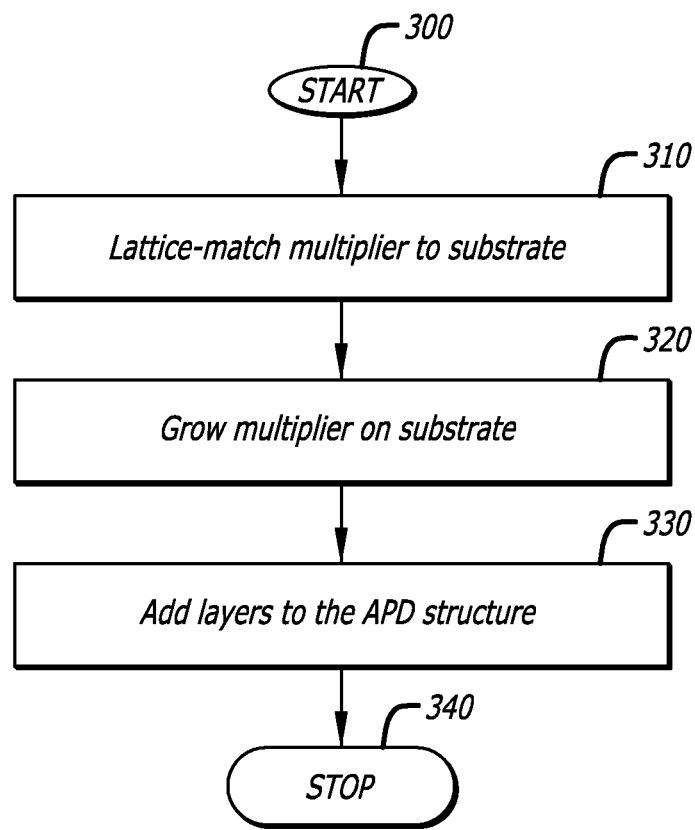
FIG. 5 shows an exemplary method of forming the avalanche photodiode of FIG. 1.

A summary view of the process for forming a high gain, low excess noise APD is provided in FIG. 5. For purposes of example, the description of the method will relate to the APD 100 of FIG. 1. The process is first started (step 300), and the buffer 180 is lattice-matched to the substrate (step 310) and grown on the InP substrate 170 (step 320). The multiplier 140 is grown with a plurality of alternating layers, in particular, quantum well 150 layers of high avalanche probability and spacer 160 layers of low avalanche probability. The quantum wells 150 may be formed of InGaAlAs and the spacers 160 may be formed of InAlAs. The buffer 180 may also be included between the substrate 170 and the first quantum well 150 layer to help control growth of the quantum wells 150. After the multiplier is formed, additional layers are added to the APD 100 (step 330), including the charge layer 130, the absorber layer 120, and the contact layer 110. During the growth, there is no intentional doping in the multiplier, such that a constant electrical field strength is maintained across the multiplier during operation of the APD. The process may then be ended (step 340).

Although certain illustrative embodiments and methods have been disclosed herein, it can be apparent from the foregoing disclosure to those skilled in the art that variations and modifications of such embodiments and methods can be made without departing from the true spirit and scope of the art disclosed. Many other examples of the art disclosed exist, each differing from others in matters of detail only. Accordingly, it is intended that the art disclosed shall be limited only to the extent required by the appended claims and the rules and principles of applicable law.

We claim:

1. A method of improving the infrared radiation detection capability of a photodiode, comprising:

growing a multiplier to a substrate to form the photodiode, the multiplier having a plurality of alternating high avalanching probability layers of quantum wells and low avalanching probability layers of spacers that provide a substantially constant electric field across the multiplier, wherein each of the high avalanching probability layers substantially comprises a first material of Gallium Arsenide (GaAs), and each of the low avalanching probability layers substantially comprises a second material of Aluminum Gallium Arsenide (AlGaAs), wherein at least one of the plurality of alternating high avalanching probability layers has a band gap of about 1.3 electron-volts, thereby allowing the photodiode to detect infrared radiation, wherein the photodiode further comprises an absorber layer of GaAs and a charge layer of AlGaAs, wherein the charge layer is between the multiplier and the absorber layer such that the charge layer is adjacent the absorber layer, and the charge layer is adjacent the multiplier.

2. The method of claim 1, wherein one of the high avalanching probability layers is grown first on the substrate.

3. The method of claim 1, wherein one of the low avalanching probability layers is grown first on the substrate.

4. The method of claim 1, wherein the substrate comprises Gallium Arsenide (GaAs).

5. The method of claim 1, wherein the photodiode further comprises a buffer layer between the substrate and the multiplier.

6. The method of claim 5, wherein the buffer layer comprises Aluminum Gallium Arsenide (AlGaAs).

7. The method of claim 1, further comprising lattice-matching at least a portion of the multiplier to the substrate.

8. The method of claim 1, wherein at least one of the plurality of alternating high avalanching probability layers and low avalanching probability layers has no added dopants.

9. The method of claim 1, further comprising configuring the multiplier to maintain the substantially constant electric field strength during operation of the photodiode.

10. The method of claim 1, wherein a gain of over 100 is provided and excess noise is reduced.

11. The method of claim 1, wherein the photodiode further comprises a contact layer adjacent the absorber layer.

12. The method of claim 11, wherein the contact layer comprises Aluminum Gallium Arsenide (AlGaAs).

13. The method of claim 1, wherein the photodiode has no added dopants.

14. A photodiode for detecting infrared radiation, comprising:

a substrate;

a multiplier grown on the substrate, the multiplier having a plurality of alternating high avalanching probability layers of quantum wells substantially comprising a first material of Gallium Arsenide (GaAs) and low avalanching probability layers of spacers substantially comprising a second material of Aluminum Gallium Arsenide (AlGaAs) that provide a substantially constant electric field across the multiplier, wherein at least one of the plurality of alternating high avalanching probability layers has a band gap of about 1.3 electron-volts, thereby allowing the photodiode to detect infrared radiation;

an absorber layer of GaAs; and a charge layer of AlGaAs between the multiplier and the absorber layer such that the charge layer is adjacent the absorber layer, and the charge layer is adjacent the multiplier.

15. The photodiode of claim 14, wherein one of the high avalanching probability layers is adjacent to the substrate.

16. The photodiode of claim 14, wherein one of the low avalanching probability layers is adjacent to the substrate.

17. The photodiode of claim 14, wherein the substrate comprises Gallium Arsenide (GaAs).

18. The photodiode of claim 14, wherein the photodiode further comprises a buffer layer between the substrate and the multiplier.

19. The photodiode of claim 18, wherein the buffer layer comprises Aluminum Gallium Arsenide (AlGaAs).

20. The photodiode of claim 14, wherein at least a portion of the multiplier is lattice-matched to the substrate.

21. The photodiode of claim 14, wherein at least one of the plurality of alternating high avalanching probability layers and low avalanching probability layers has no added dopants.

22. The photodiode of claim 14, wherein the multiplier is configured to maintain the substantially constant electric field strength during operation of the photodiode.

23. The photodiode of claim 14, wherein the photodiode has a gain of over 100 and a reduction in excess noise.

24. The photodiode of claim 14, wherein the photodiode further comprises a contact layer adjacent the absorber layer.

25. The photodiode of claim 24, wherein the contact layer comprises Aluminum Gallium Arsenide (AlGaAs).

26. The photodiode of claim 14, wherein the photodiode has no added dopants.

* * * * *